(12) United States Patent
Pontarollo et al.

(10) Patent No.: US 8,149,056 B2
(45) Date of Patent: Apr. 3, 2012

(54) AMPLIFYING CIRCUIT

(75) Inventors: Serge Pontarollo, Saint Egreve (FR); Serge Ramet, Jarrie (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 59 days.

(21) Appl. No.: 12/539,644

(22) Filed: Aug. 12, 2009

(65) Prior Publication Data

US 2010/0039180 A1 Feb. 18, 2010

(30) Foreign Application Priority Data

Aug. 14, 2008 (EP) .................................. 08305481

(51) Int. Cl.
*H03F 3/18* (2006.01)
(52) U.S. Cl. ....................................... 330/264; 330/255
(58) Field of Classification Search .................. 330/264, 330/255, 260, 261, 257
See application file for complete search history.

(56) References Cited

U.S. PATENT DOCUMENTS

| | | | |
|---|---|---|---|
| 4,268,789 A | | 5/1981 | Nagano |
| 5,148,120 A | * | 9/1992 | Kano et al. ................... 330/264 |
| 5,894,236 A | * | 4/1999 | Mizoguchi et al. ........... 327/108 |
| 6,100,762 A | | 8/2000 | Kato |
| 6,384,685 B1 | * | 5/2002 | Juang ........................... 330/264 |
| 6,657,495 B2 | * | 12/2003 | Ivanov et al. ................. 330/255 |
| 6,930,551 B2 | * | 8/2005 | Ivanov et al. ................. 330/264 |
| 7,057,459 B2 | * | 6/2006 | Ueno ............................ 330/255 |
| 7,466,201 B1 | * | 12/2008 | Ivanov et al. ................. 330/264 |
| 7,786,802 B2 | * | 8/2010 | Liu ............................... 330/255 |
| 2005/0057307 A1 | * | 3/2005 | Zhang et al. .................. 330/264 |

OTHER PUBLICATIONS

European Search Report dated Jan. 20, 2009, from corresponding European Application No. 08305481.7.
Vincence V C et al: *Low-Voltage class AB operational amplifier*, Integrated Circuits and Systems Design, 2001, 14TH Symposium on. Sep. 10-15, 2001, Piscataway, NJ, USA,IEEE, Sep. 10, 2001, pp. 207-211, XPO10558892.
Klaas-Jan De Langen et al: *Compact Low-Voltage Power-Efficient Operational Amplifier Cells for VLSI*, IEEE Journal of Solid-State Circuits, IEEE Service Center, Piscataway, NJ, US, vol. 33, No. 10, Oct. 1, 1998, XP011060825.
Mikko Loikkanen et al: *Low Voltage CMOS Power Amplifier with Rail-to-Rail Input and Output*, Analog Integrated Circuits and Signal Processing, Kluwer Academic Publishers, BO, vol. 46, No. 3, Mar. 1, 2006, pp. 183-192, XP019204106.

* cited by examiner

*Primary Examiner* — Henry Choe
(74) *Attorney, Agent, or Firm* — Wolf, Greenfield & Sacks, P.C.

(57) ABSTRACT

An amplifier having an output stage with a complementary pair of first and second transistors each coupled to an output node of the amplifier; control circuitry arranged to provide a control signal at a control node of the first transistor based on the voltage at an input node of the amplifier; and adjustment circuitry arranged to adjust the control signal to maintain the current through the first transistor above a minimum value.

33 Claims, 2 Drawing Sheets

AMPLIFYING CIRCUIT

CROSS REFERENCE TO RELATED APPLICATIONS

This application claims the priority benefit of European patent application number 08305481.7, filed on Aug. 14, 2008, entitled AMPLIFYING CIRCUIT," which is hereby incorporated by reference to the maximum extent allowable by law.

BACKGROUND OF THE INVENTION

1. Field of the Invention

The present invention relates to an amplifying circuit, and in particular to an amplifying circuit of class AB type, comprising a complementary pair of output transistors.

2. Discussion of the Related Art

FIG. 1 illustrates an amplifying circuit 100 of class AB type, and reproduces a part of an amplifying circuit described in the publication "A CMOS Low-Distortion Fully Differential Power Amplifier with Double Nested Miller Compensation", Sergio Pernici et al., IEEE.

Amplifier 100 comprises an input node 102, and an output node 104. The output node 104 is coupled to a complementary pair of output power transistors 106 and 108 forming an output stage of class AB type. Transistors 106 and 108 are coupled in series between ground and positive supply rails. Transistor 106 is a P-channel MOS transistor while transistor 108 is an N-channel MOS transistor. The gate node of transistor 108 is coupled to the input node 102. The input node 102 is also coupled to a control stage for controlling the PMOS transistor 106. In particular, input node 102 is coupled to the gate node of an N-channel MOS transistor 110. Transistor 110 has its source terminal coupled to the ground voltage rail and its drain terminal coupled to a node 111 via an N-channel MOS transistor 112. Node 111 is further coupled to the positive supply rail via a P-channel MOS transistor 114, having its gate node coupled to node 111. PMOS 114 forms a current mirror configuration with a P-channel MOS transistor 116, which also has its gate node coupled to node 111. PMOS 116 is coupled between the positive supply rail and a node 117, which is coupled to the gate node of P-channel MOS transistor 106. Node 117 is also coupled to the ground supply rail via a further N-channel MOS transistor 113 and a current source 118. Transistors 112 and 113 have their gate nodes connected to a fixed voltage VB.

In operation, the output transistors 106 and 108 of the class AB type allow of the amplifier to drive an output load from either the positive or ground supply rail. It has been found that at relatively high frequencies of the input signal and at relatively low loads, for example of around 2 k Ohms or less, the signal at the output node 104 of the amplifier 100 tends to be distorted. There is thus a need for an improved amplifying circuit that does not suffer such distortions.

SUMMARY OF THE INVENTION

It is an aim of the present invention to at least partially address one or more problems in the prior art.

According to one aspect of the present invention, there is provided an amplifier comprising an output stage comprising a complementary pair of first and second transistors each coupled to an output node of the amplifier; control circuitry arranged to provide a control signal at a control node of the first transistor based on the voltage at an input node of the amplifier; and adjustment circuitry arranged to adjust the control signal to increase the current through the first transistor if it falls below a minimum value.

According to another embodiment of the present invention, the adjustment circuitry comprises a third transistor coupled between the control node and a first supply voltage level.

According to another embodiment of the present invention, the amplifier further comprises detection circuitry adapted to detect when the current through said first transistor falls below the minimum value and to control said third transistor based on said detection.

According to an embodiment of the present invention, the amplifier further comprises detection circuitry comprising a first variable current source controlled by the control signal; and a first fixed current source coupled in series with the first variable current source, wherein said third transistor is controlled by a voltage level at an intermediate node between the first variable current source and the first fixed current source.

According to another embodiment of the present invention, the first fixed current source is arranged to conduct a current equal to $I_{MIN}/P$, where $I_{MIN}$ is the minimum value and P is a ratio between the current flowing through the first transistor and the current flowing through the first variable current source.

According to another embodiment of the present invention, the minimum value is chosen to equal $I_Q/N$, where $I_Q$ is the quiescent current that flows through the first and second transistors and N is a value between 1 and 4.

According to another embodiment of the present invention, N is equal to between 2 and 3.

According to another embodiment of the present invention, the input node of the amplifier is coupled to the control node of the second transistor, and wherein the control circuitry comprises a second variable current source controlled by the voltage at the input node of the amplifier, a current mirror comprising a first branch coupled to the second variable current source and a second branch coupled to a second fixed current source, wherein the control node of the first transistor is controlled by the voltage at the node between the second branch of the current mirror and the second fixed current source.

According to another embodiment of the present invention, the amplifier further comprises a resistor coupled between the second variable current source and the first branch of the current mirror.

According to another embodiment of the present invention, the amplifier further comprises third and fourth fixed current sources coupled to respective branches of the current mirror and arranged to conduct a fixed current, such that the first and second branches of the current mirror conduct at least the fixed current.

According to another embodiment of the present invention, the first transistor is a P-channel MOS transistor.

According to another embodiment of the present invention, the amplifier further comprises a first compensation capacitor coupled between the output node and the control node of the first transistor, and a second compensation capacitor coupled between the output node and the control node of the second transistor.

According to one aspect of the present invention, there is provided a device comprising the above amplifier.

According to another embodiment of the present invention, the device further comprises a pre-amplifying stage coupled to the input node of the amplifier and arranged to compare an input voltage signal with a feedback voltage signal based on the output of the amplifier.

According to another embodiment of the present invention, the device is a portable electronics device.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
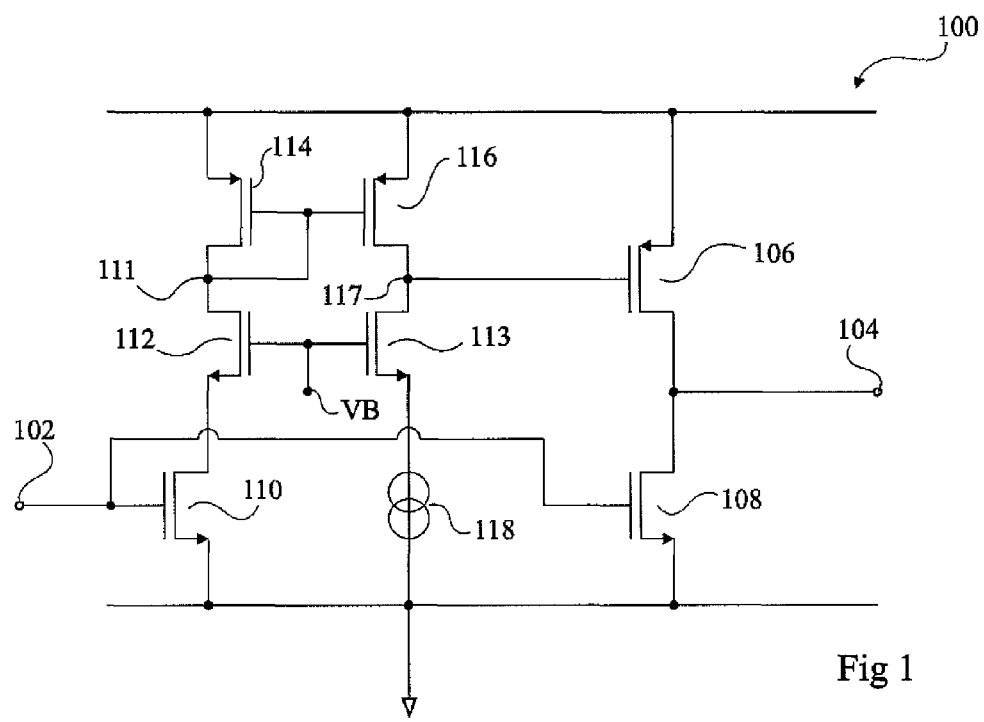
FIG. 1 (described above) illustrates an amplifying circuit.

With reference again to the amplifying circuit of FIG. 1, the inventors have found that distortion at the output node 104 in the circuit may at least partially be attributed to the fact that transistor 106 turns off completely when the output voltage is less than half the supply voltage. Distortion is caused by the extra time delay needed for transistor 106 to come one again when the output voltage is required to rise.

Figure 2:
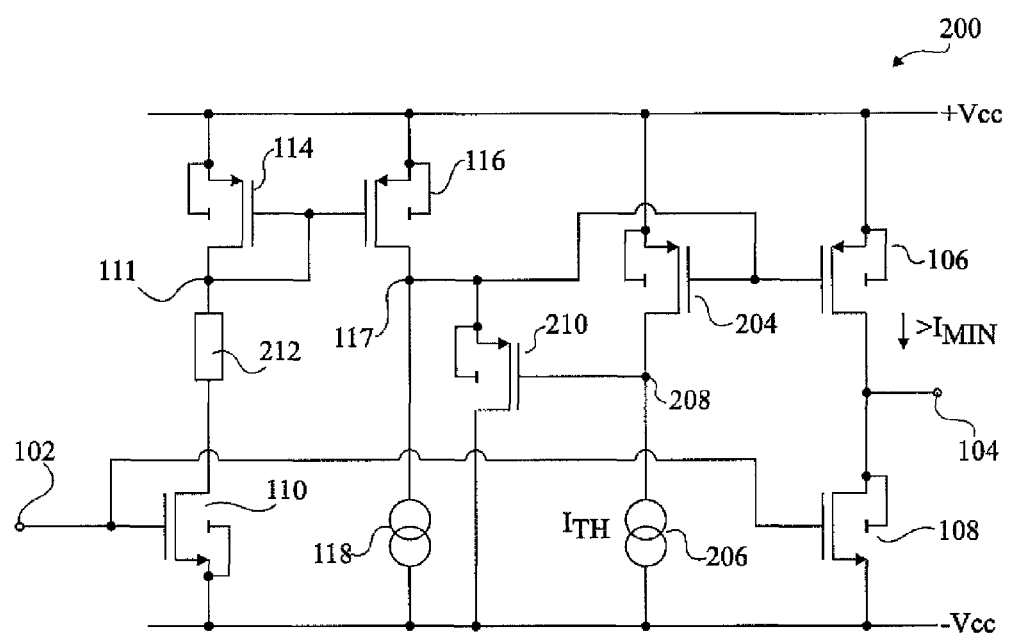
FIG. 2 illustrates an amplifying circuit according to an embodiment of the present invention.

FIG. 2 illustrates an amplifying circuit 200. Features of the amplifying circuit 200 that are the same as those shown in FIG. 1 are referenced with like reference characters, and will not be described again in detail.

In the amplifying circuit 200 of FIG. 2, the positive supply rail has been labelled Vcc and the negative supply rail –Vcc. It will be apparent to those skilled in the art that in alternative embodiments any values for the supply rail voltages are possible, and the single supply of FIG. 1 could also be used, with –Vcc replaced by a ground voltage. Whereas the load coupled to the output node 104 of FIG. 2 will generally be grounded when positive and negative supply voltages are used, when a single supply rail is provided, the load is generally coupled to Vcc/2. The load coupled to the output node 104 is not shown in FIG. 2, but is, for example, a load on the order of 2 k Ohms. A single supply rail could, for example, be provided at 5 V, while positive and negative supply rails could be provided at +2.5 and –2.5 V, although other values are possible.

In the circuit of FIG. 2, transistor 112 is replaced by a resistor 212 coupled between transistor 110 and node 111, while transistor 113 is removed and node 117 coupled directly to current source 118.

Furthermore, as illustrated, in this embodiment the gate node of the PMOS transistor 106 is coupled to the gate node of a further PMOS transistor 204, which, for example, is of the same size and type as PMOS 106, or of a fixed ratio different from PMOS 106, such that the current flow through transistor 204 either matches the current through transistor 106, or is a fixed ratio thereof. Transistor 204 is coupled in series with a fixed current source 206, between the positive supply voltage Vcc and a negative supply voltage –Vcc Fixed current source 206 conducts a current of $I_{TH}$. A node 208 between the transistor 204 and the fixed current source 206 is coupled to the gate node of a PMOS transistor 210, which is coupled between node 117 and the negative supply rail.

In operation, the current $I_{TH}$ through the fixed current source provides a threshold current and is chosen based on the minimum current $I_{MIN}$ that is to be maintained through transistor 106. In particular, $I_{TH}$ is, for example, chosen to be equal to $I_{MIN}/P$, where P is the fixed ratio between the current flow through transistor 106 and the current flow through transistor 204. P could be equal to any ratio between 1 and several hundred, but is preferably lower than 50, and is, for example, around 10. If the current through transistor 106 falls below $I_{MIN}$, this means that the current through transistor 204 likewise falls below the threshold $I_{TH}$, and a voltage at node 208 drops. This in turn increases the voltage difference between node 117 and node 208, thereby turning transistor 210 on. This has the effect of reducing the voltage at the gate node of transistor 106, and thereby turning transistor 206 on more, until the current reaches the minimum value $I_{MIN}$. Thus this circuitry provides an internal feedback loop, which the inventors have found to be stable.

The value of the minimum current $I_{MIN}$ is, for example, chosen based on a fraction of the quiescent current of PMOS 106, which is defined as the current flowing through PMOS 106 and NMOS 108 when the input of the amplifier is at a quiescent state, for example at zero volts when the supply rail voltages are centered around zero volts, and there is no current through the load coupled to node 104. The value of $I_{MIN}$ is, for example, chosen as the minimum value which results in an acceptable distortion level. In particular, $I_{TH}$, for example, equals $I_{MIN}/P$, where $I_{MIN}$ is equal to a fraction IQ/N of the quiescent current IQ through transistors 106 and 108 and N is a value dividing the quiescent current, preferably equal to between 1 and 4. It has been found by the inventors that a value of N of between 2 and 3 works particularly well. As an example, the quiescent current IQ for example equals 36 μA, P is equal to 10, N is equal to 2, and the current $I_{TH}$ of current source 106 is equal to 1.8 μA. Thus when the current through PMOS 106 falls below 18 μA, transistor 210 turns on to reduce the voltage at node 117, and thereby increase the current through PMOS 106 to 18 μA.

Figure 3:
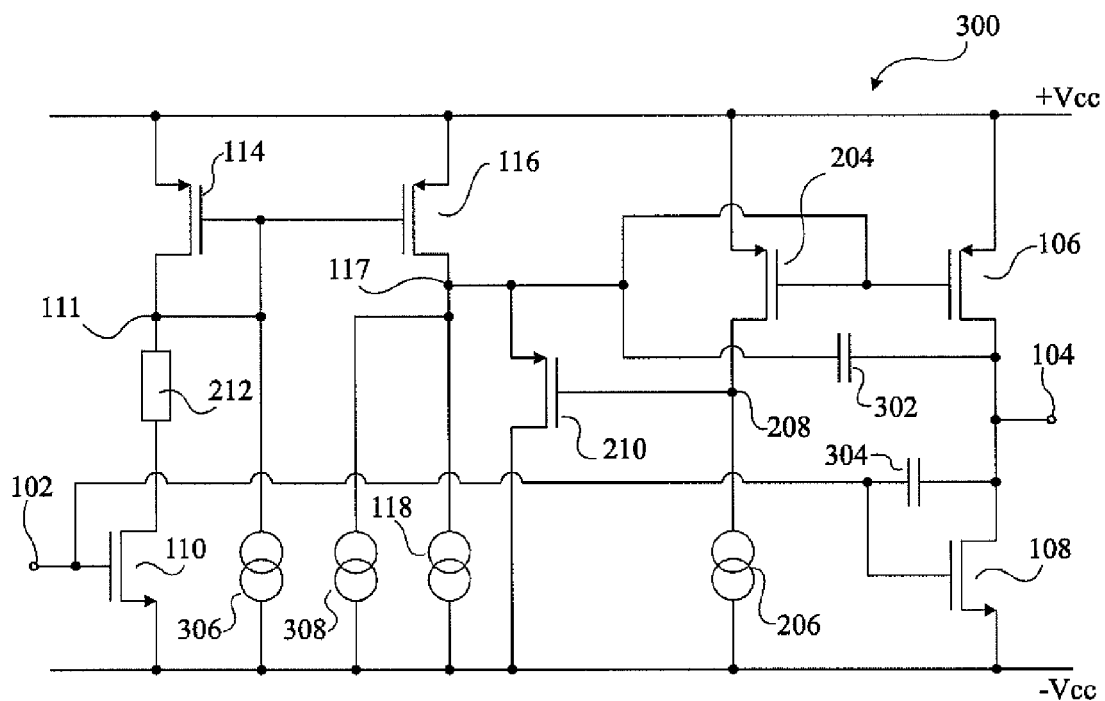
FIG. 3 illustrates an amplifying circuit according to a further embodiment of the present invention.

FIG. 3 illustrates an amplifying circuit 300. Components that are in common with those of FIG. 2 have been labelled with like reference characters and will not be described again in detail.

In circuit 300, compensation capacitors 302 and 304 are provided. Capacitor 302 is coupled between the output node 104 and node 117. Capacitor 304 is coupled between the output node 104 and the input node 102. Such capacitors may also be provided between these nodes in the circuit of FIG. 2.

The circuit further comprises additional fixed current sources 306 and 308. Current source 306 is coupled between node 111 and the negative supply rail –Vcc. Fixed current source 308 is coupled between node 117 and the negative supply rail –Vcc. These fixed current sources are chosen to provide the same current as each other, and preferably conduct a low current value, for example equal to approximately 1 μA.

In the case that current sources 306 and 308 are not provided and the output voltage has a positive slope driving a load of for example around 2 k Ohms, when the output voltage goes above 0 V, the load does not generally provide appropriate charging of the compensation capacitor 304. Transistors 110 and 108 turn off, because the voltage at node 102 falls. This in turn results in no current flowing through transistors 114 and 116 of the current mirror. A consequence is that the voltage at node 117 drops sharply, increasing the VGS voltage and current drain of transistor 106. The delay taken for the structure to recover and bring the voltage at node 117 to the correct value results in some distortion at the output.

However, when current sources 306 and 308 are provided, even when transistor 110 is off, at least some current flows through transistors 114 and 116, and thus they are not switched off completely. This reduces distortion of the output voltage at node 104 of the amplifier.

Figure 4:
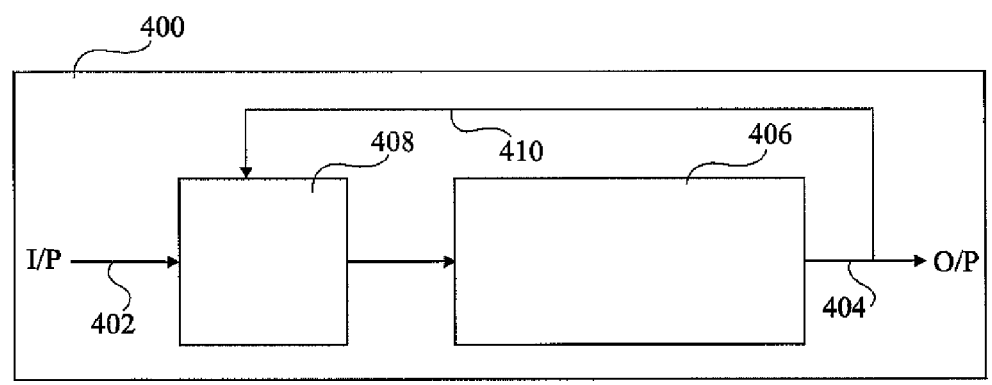
FIG. 4 illustrates an electronic device comprising the amplifier of FIGS. 2 or 3 according to an embodiment of the present invention.

FIG. 4 illustrates an electronic device 400 comprising the amplifier of FIGS. 2 or 3. In particular, the amplifier includes an input node 402, an output node 404, and a number of amplifying stages coupled between these input and output nodes. In particular, block 406 represents the amplifier of FIGS. 2 or 3, while block 408 represents other amplifying circuitry, such as pre-amplifiers, and comprises an input for receiving a feedback signal on a line 410 from the output 404, allowing the amplifier to be adjusted to ensure that the output voltage matches the required level.

The electronic device is, for example, any device having a class AB amplifier, such as a portable electronics device, for example a mobile telephone, an MP3 player, portable games console, laptop etc., or larger devices such as set-top boxes, personal computers, digital television, DVD players etc.

An advantage of the embodiments described herein is that low distortion at the output of the amplifier can be achieved for a wide range of frequencies and at relatively low load resistances. In particular, it has been found that the total harmonic distortion can improve from 2.5 percent in the case of the circuit of FIG. 1 to less than 1 percent in the case of the circuit of FIG. 3.

A further advantage of the embodiments described herein is that such circuits may work with very low supply voltages, for example as low as 0.75 V for Vcc and −0.75 for −Vcc, or in the case that a single supply voltage is provided and the other rail grounded, a supply voltage of as low as 1.5 V.

A further advantage of the embodiments described herein is that they have low power consumption. In particular, while a solution for lowering the voltage at node 117 would have been to increase the current through transistor 116, this would have led to greater power consumption. By advantageously using the solutions described above, very little additional current is consumed.

The advantage of providing a resistor 212 coupled between one branch of the current mirror and transistor 110 is that the current and thus also the consumption of the current mirror can be reduced, particularly when the circuit is in an open loop configuration, without a feedback loop. Furthermore, the use of a resistor to limit current allows a large operating supply voltage range.

The advantage of the circuit of FIG. 3 is that, by ensuring that transistors 114 and 116 of the current mirror are never turned completely off, distortion can further be reduced.

Having thus described at least one illustrative embodiment of the invention, various alterations, modifications and improvements will readily occur to those skilled in the art.

For example, while a circuit for amplifying a single signal and providing a single ended output has been shown, it will be apparent to those skilled in the art that the circuit may be replicated to provide differential inputs and differential outputs. In other words, the input 402 and output 404 of the amplifier shown in the electronic device 400 of FIG. 4 may be differential signals.

Furthermore, while in the embodiments of FIGS. 2 and 3 transistors 106, 204 and 210 are PMOS transistors and transistor 108 an NMOS transistor, it will be apparent to those skilled in the art that in alternative embodiments the circuit could be rearranged such that PMOS transistors 106, 204 and 210 are replaced by NMOS transistors, and NMOS transistor 108 by a PMOS transistor.

Furthermore, while in the described embodiments the transistors are MOS, it will be apparent for those skilled in the art that in some embodiments other types of transistors may be used, including transistors having gates formed of metal silicide, and insulating layers formed of other materials to oxide.

Furthermore, it will be apparent to those skilled in the art that in alternative embodiments the resistance 212 could be replaced by the transistors 112 and 113 of FIG. 1 in each side of the current mirror and controlled by a fixed voltage.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier comprising:
    an output stage comprising a complementary pair of first and second transistors each coupled to an output node of the amplifier;
    control circuitry arranged to provide a control signal at a control node of said first transistor based on the voltage at an input node of said amplifier; and
    adjustment circuitry comprising a first fixed current source and arranged to adjust said control signal to increase the current through said first transistor responsive to the current through said first transistor falling below a minimum value.

2. The amplifier of claim 1, wherein the adjustment circuitry comprises a third transistor coupled between said control node and a first supply voltage level.

3. The amplifier of claim 2, further comprising detection circuitry adapted to detect when the current through said first transistor falls below the minimum value and to control said third transistor based on said detection.

4. The amplifier of claim 3, wherein said detection circuitry comprises:
    a first variable current source controlled by said control signal; and
    the first fixed current source coupled in series with said first variable current source, wherein said third transistor is controlled by a voltage level at an intermediate node between said first variable current source and said first fixed current source.

5. The amplifier of claim 4, wherein said first fixed current source is arranged to conduct a current equal to $I_{MIN}/P$, where $I_{MIN}$ is the minimum value and P is a ratio between the current flowing through the first transistor and the current flowing through the first variable current source.

6. The amplifier of claim 1, wherein the minimum value is chosen to equal $I_Q/N$, where $I_Q$ is the quiescent current that flows through the first and second transistors and N is a value between 1 and 4.

7. The amplifier of claim 6, wherein N equals between 2 and 3.

8. The amplifier of claim 1, wherein said input node of the amplifier is coupled to the control node of said second transistor, and wherein said control circuitry comprises a second variable current source controlled by the voltage at said input node of the amplifier, a current mirror comprising a first branch coupled to said second variable current source and a second branch coupled to a second fixed current source, wherein said control node of said first transistor is controlled by the voltage at the node between said second branch of the current mirror and said second fixed current source.

9. The amplifier of claim 8, further comprising a resistor coupled between the second variable current source and the first branch of the current mirror.

10. The amplifier of claim 8, further comprising third and fourth fixed current sources coupled to respective branches of said current mirror and arranged to conduct a fixed current, such that the first and second branches of the current mirror conduct at least said fixed current.

11. The amplifier of claim 1, wherein said first transistor is a P-channel MOS transistor.

12. The amplifier of claim 1, further comprising a first compensation capacitor coupled between said output node and said control node of the first transistor, and a second compensation capacitor coupled between said output node and the control node of the second transistor.

13. A device comprising the amplifier of claim 1.

14. The device of claim 13, further comprising a pre-amplifying stage coupled to the input node of the amplifier and arranged to compare an input voltage signal with a feedback voltage signal based on the output of said amplifier.

15. The device of claim 13, wherein the device is a portable electronics device.

16. A device comprising:
an output stage of an amplifier comprising a complementary pair of first and second transistors each coupled to an output node of the amplifier; and
means for adjusting, comprising a first fixed current source, a first control signal at a first control node of the first transistor to increase the current through the first transistor responsive to the current through the first transistor falling below a selected minimum value.

17. The device of claim 16, wherein the device comprises a portable electronic device.

18. The device of claim 16, wherein the minimum value is selected to approximately equal $I_Q/N$, where $I_Q$ is the quiescent current that flows through the first and second transistors and N is a value between 2 and 3.

19. The device of claim 16, wherein the means for adjusting comprises a third transistor having current terminals coupled between the first control node and a first supply voltage level.

20. The device of claim 19, wherein the means for adjusting further comprises:
a first variable current source configured to be controlled by the first control signal; and
the first fixed current source coupled in series with the first variable current source, wherein the third transistor is configured to be controlled by a voltage level at an intermediate node between said first variable current source and said first fixed current source.

21. The device of claim 20, wherein the first fixed current source is configured to conduct a current equal to $I_{MIN}/P$, where $I_{MIN}$ is the minimum value and P is a ratio between a current flow level through the first transistor and a current flow level through the first variable current source.

22. The device of claim 21, wherein P is selected to be any value between about 1 and about 50.

23. The device of claim 21, wherein $I_{MIN}$ is selected to approximately equal $I_Q/N$, where $I_Q$ is the quiescent current that flows through the first and second transistors and N is a value between 2 and 3.

24. The device of claim 16, further comprising control circuitry configured to provide the first control signal at the first control node of the first transistor based on a voltage at an input node of the amplifier.

25. The device of claim 24, wherein the control circuitry comprises:
a current mirror having a first branch and a second branch, the first branch configured such that a signal at an input node of the amplifier alters current flowing in the first branch; and
a coupling between a node on the second branch and the first control node such that a voltage at the node on the second branch is provided to the first control node.

26. The device of claim 25, further comprising:
the first fixed current source in the first branch of the current mirror; and
a second fixed current source in the second branch of the current mirror,
wherein the current branches and current sources are configured such that the first branch conducts at least a current determined by the first fixed current source and the second branch conducts at least a current determined by the second fixed current source.

27. The device of claim 25, further comprising:
a first compensation capacitor coupled between the output node and the first control node; and
and a second compensation capacitor coupled between the output node and a control node of the second transistor.

28. A method of amplifying a signal, the method comprising:
receiving a first control signal at a first control terminal of a first transistor in an output stage of an amplifier, the first control signal based upon an input signal level applied to an input node of the amplifier and the first transistor configured to drive current at an output node of the amplifier;
detecting whether current through the first transistor falls below a selected minimum value; and
adjusting the first control signal to increase current through the first transistor responsive to detecting that the current through the first transistor falls below the minimum value,
wherein the adjusting is dependent upon an amount of current delivered to a constant current source.

29. The method of claim 28, wherein the detecting comprises sensing a voltage level in a circuit branch that includes a second transistor configured in a current mirror arrangement with the first transistor.

30. The method of claim 29, wherein the sensing is carried out using a third transistor having a second control terminal coupled to a node in the circuit branch.

31. The method of claim 29, wherein the adjusting is carried out using the third transistor having a current terminal coupled to the first control terminal of the first transistor.

32. The method of claim 28, wherein the minimum value is selected to be approximately $I_Q/N$, where $I_Q$ is a quiescent current that flows through the first transistor and N is a value between 1 and 4.

33. The method of claim 28, wherein the minimum value is selected to be approximately $I_Q/N$, where $I_Q$ is a quiescent current that flows through the first transistor and N is a value between 2 and 3.

* * * * *

UNITED STATES PATENT AND TRADEMARK OFFICE
CERTIFICATE OF CORRECTION

| | | |
|---|---|---|
| PATENT NO. | : 8,149,056 B2 | Page 1 of 1 |
| APPLICATION NO. | : 12/539644 | |
| DATED | : April 3, 2012 | |
| INVENTOR(S) | : Serge Pontarollo et al. | |

It is certified that error appears in the above-identified patent and that said Letters Patent is hereby corrected as shown below:

Claim 8, col. 6, line 64 should read:
current mirror and said second fixed current source.

Signed and Sealed this
Eighth Day of May, 2012

David J. Kappos
*Director of the United States Patent and Trademark Office*